(12) United States Patent
Matsuura

(10) Patent No.: US 12,173,207 B2
(45) Date of Patent: Dec. 24, 2024

(54) METHOD OF MANUFACTURING AN ELECTRONIC DEVICE

(71) Applicant: DU PONT CHINA LIMITED, Wilmington, DE (US)

(72) Inventor: Yumi Matsuura, Kanagawa (JP)

(73) Assignee: Celanese Mercury Holdings Inc., Wilmington, DE (US)

(*) Notice: Subject to any disclaimer, the term of this patent is extended or adjusted under 35 U.S.C. 154(b) by 6 days.

(21) Appl. No.: 16/855,605

(22) Filed: Apr. 22, 2020

(65) Prior Publication Data

US 2020/0248040 A1    Aug. 6, 2020

Related U.S. Application Data

(62) Division of application No. 15/704,456, filed on Sep. 14, 2017, now Pat. No. 10,696,875.

(30) Foreign Application Priority Data

Sep. 15, 2016   (JP) .................................. 2016-180702
Sep. 15, 2016   (JP) .................................. 2016-180705

(51) Int. Cl.
*B23K 35/02*      (2006.01)
*C08L 1/28*       (2006.01)
(Continued)

(52) U.S. Cl.
CPC ............... *C09J 9/02* (2013.01); *B23K 35/025* (2013.01); *C08L 1/28* (2013.01); *C09J 5/06* (2013.01); *C09J 11/04* (2013.01); *C09J 11/06* (2013.01); *C09J 101/28* (2013.01); *H01L 24/05* (2013.01); *H01L 24/29* (2013.01);

*H01L 24/83* (2013.01); *C08K 2003/0806* (2013.01); *C08K 2201/001* (2013.01); *C09J 2401/00* (2013.01);
(Continued)

(58) Field of Classification Search
None
See application file for complete search history.

(56) References Cited

U.S. PATENT DOCUMENTS 4,273,593 A    6/1981  Mastrangelo
4,541,876 A    9/1985  Hwang
(Continued)

FOREIGN PATENT DOCUMENTS

CN    107828351 A     3/2018
DE    102017008633 A1  3/2018
(Continued)

*Primary Examiner* — Devang R Patel
(74) *Attorney, Agent, or Firm* — Dority & Manning, P.A.

(57) ABSTRACT

A method of manufacturing an electronic device comprising the steps of: preparing a substrate comprising an electrically conductive layer; applying a conductive paste on the electrically conductive layer; mounting an electrical component on the applied conductive paste; heating the conductive paste to bond the electrically conductive layer and the electrical component, wherein the conductive paste comprises 100 parts by weight of the metal powder, 5 to 20 parts by weight of a solvent, and 0.05 to 3 parts by weight of a polymer, wherein the polymer comprises a first polymer and a second polymer, wherein the molecular weight (Mw) of the first polymer is 5,000 to 95,000, and the molecular weight (Mw) of the second polymer is 100,000 to 300,000.

13 Claims, 1 Drawing Sheet

(51) Int. Cl.
  *C09J 5/06*   (2006.01)
  *C09J 9/02*   (2006.01)
  *C09J 11/04*  (2006.01)
  *C09J 11/06*  (2006.01)
  *C09J 101/28* (2006.01)
  *H01L 23/00*  (2006.01)
  *C08K 3/08*   (2006.01)

(52) U.S. Cl.
  CPC . *C09J 2433/00* (2013.01); *H01L 2224/05639* (2013.01); *H01L 2224/05644* (2013.01); *H01L 2224/05647* (2013.01); *H01L 2224/05655* (2013.01); *H01L 2224/2732* (2013.01); *H01L 2224/27332* (2013.01); *H01L 2224/2747* (2013.01); *H01L 2224/2929* (2013.01); *H01L 2224/29324* (2013.01); *H01L 2224/29339* (2013.01); *H01L 2224/29344* (2013.01); *H01L 2224/29347* (2013.01); *H01L 2224/29355* (2013.01); *H01L 2224/29364* (2013.01); *H01L 2224/29369* (2013.01); *H01L 2224/29373* (2013.01); *H01L 2224/32151* (2013.01); *H01L 2224/32227* (2013.01); *H01L 2224/83048* (2013.01); *H01L 2224/83097* (2013.01); *H01L 2224/83191* (2013.01); *H01L 2224/83208* (2013.01); *H01L 2224/83851* (2013.01); *H01L 2924/1205* (2013.01); *H01L 2924/1206* (2013.01); *H01L 2924/1207* (2013.01); *H01L 2924/13072* (2013.01); *H01L 2924/14* (2013.01)

(56) References Cited

U.S. PATENT DOCUMENTS

| | | | |
|---|---|---|---|
| RE32,309 | E | 12/1986 | Hwang |
| 5,064,482 | A | 11/1991 | Goobich et al. |
| 5,150,832 | A | 9/1992 | Degani et al. |
| 5,326,390 | A | 7/1994 | Tecle |
| 6,624,225 | B1 | 9/2003 | Ellison et al. |
| 7,276,325 | B2 | 10/2007 | Hayakawa |
| 10,308,856 | B1 * | 6/2019 | Wang .................. C09K 5/14 |
| 2005/0187329 | A1 | 8/2005 | Ogiwara |
| 2009/0173919 | A1 | 7/2009 | Webster et al. |
| 2012/0309866 | A1 | 12/2012 | Jang et al. |
| 2013/0189831 | A1 | 7/2013 | Li et al. |
| 2014/0120356 | A1 | 5/2014 | Shearer et al. |
| 2015/0060742 | A1 | 3/2015 | Glicksman et al. |
| 2016/0093545 | A1 * | 3/2016 | Lee .................. H01L 23/3135 |
| | | | 257/729 |
| 2018/0056455 | A1 | 3/2018 | Venkatagiriyappa et al. |
| 2018/0072923 | A1 | 3/2018 | Matsuura |

FOREIGN PATENT DOCUMENTS

| | | |
|---|---|---|
| JP | 2015-129226 A1 | 7/2015 |
| JP | 2016-069710 A  | 5/2016 |
| JP | 2016-115560 A1 | 6/2016 |
| JP | 6079888 B2     | 1/2017 |

* cited by examiner

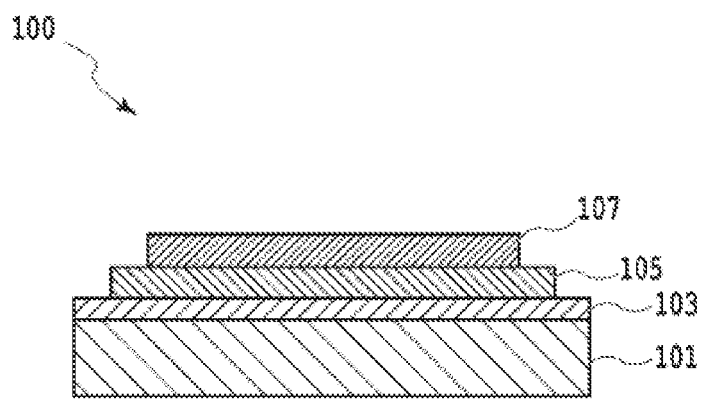

METHOD OF MANUFACTURING AN ELECTRONIC DEVICE

FIELD OF THE INVENTION

The present invention relates to a conductive paste for bonding and a method for manufacturing an electronic device using the conductive paste.

TECHNICAL BACKGROUND OF THE INVENTION

An electronic device frequently comprises an electrical or electronic component such as a semiconductor chip that is bonded to an electrically conductive layer of a substrate using a conductive paste.

In this approach, the electrical component is physically and electrically connected to the electrically conductive layer by applying conductive paste onto the electrically conductive layer, mounting the electrical component on the conductive paste, and then heating the conductive paste. It has been found that currently used manufacturing processes and pastes frequently do not provide sufficient adhesion between the mounted electrical component and the conductive paste layer, so that the electrical component may peel off and cause defects in the electronic device.

JP2016-069710 discloses a joint material to manufacture an electrical device. The joint material contains silver nano particles having particle diameter of 1 to 200 nm and octanediol.

SUMMARY OF THE INVENTION

Aspects of the present invention provide a conductive paste that is capable of satisfactorily adhering an electrical component to a substrate during a manufacturing process, and a method of manufacturing an electrical or electronic device using the conductive paste.

An aspect of the invention relates to a method of manufacturing an electronic device comprising the steps of: preparing a substrate comprising an electrically conductive layer, applying a conductive paste on the electrically conductive layer; wherein the conductive paste is a conductive paste for bonding comprising 100 parts by weight of a metal powder, 5 to 20 parts by weight of a solvent, and 0.05 to 3 parts by weight of a polymer, wherein the polymer comprises a first polymer and a second polymer, wherein the molecular weight (Mw) of the first polymer is 5,000 to 95,000, and the molecular weight (Mw) of the second polymer is 100,000 to 300,000; mounting an electrical component on the applied conductive paste; heating the conductive paste to bond the electrically conductive layer and the electrical component.

Another aspect of the invention relates to a conductive paste for bonding comprising 100 parts by weight of the metal powder, 5 to 20 parts by weight of a solvent, and 0.05 to 3 parts by weight of a polymer, wherein the polymer comprises a first polymer and a second polymer, wherein the molecular weight (Mw) of the first polymer is 5,000 to 95,000, and the molecular weight (Mw) of the second polymer is 100,000 to 300,000.

Another aspect of the invention relates to a method of manufacturing an electronic device comprising the steps of: preparing a substrate comprising an electrically conductive layer; applying a conductive paste on the electrically conductive layer; wherein the conductive paste is a conductive paste for bonding comprising a metal powder and a solvent, wherein the solvent comprises a first solvent and a second solvent, wherein the boiling point of the first solvent is 100 to 280° C., and the boiling point of the second solvent is 285 to 500° C.; mounting an electrical component on the applied conductive paste; and heating the conductive paste to bond the electrically conductive layer and the electrical component.

Another aspect of the invention relates to a conductive paste for bonding comprising a metal powder and a solvent, wherein the solvent comprises a first solvent and a second solvent, wherein the boiling point of the first solvent is 100 to 280° C., and the boiling point of the second solvent is 285 to 500° C.

Another aspect of the invention relates to a conductive paste for bonding comprising a metal powder, a solvent and a polymer, wherein the solvent comprises a first solvent and a second solvent, wherein the boiling point of the first solvent is 100 to 280° C., and the boiling point of the second solvent is 285 to 500° C., wherein the polymer comprises a first polymer and a second polymer, wherein the molecular weight (Mw) of the first polymer is 5,000 to 95,000, and the molecular weight (Mw) of the second polymer is 100,000 to 300,000.

BRIEF DESCRIPTION OF THE DRAWING

FIG. 1 is a schematic drawing showing a cross-sectional view of an exemplary electronic device.

DETAILED DESCRIPTION OF INVENTION

An electronic device comprises at least a substrate comprising an electrically conductive layer and an electrical component. The electrically conductive layer of the substrate and the electrical component are bonded by the conductive paste. One embodiment of a method of manufacturing an electronic device 100 is explained by reference to FIG. 1.

The device is constructed on a substrate 101 that comprises an electrically conductive layer 103. In different embodiments, the conductive layer 103 may comprise a metallic conductor and a semiconductor. The electrically conductive layer 103 can also be an electrical circuit, an electrode or an electrical pad in certain embodiments. The electrically conductive layer 103 can be a layer of any suitable metal in another embodiment. The metal layer can comprise copper, silver, gold, nickel, palladium, platinum, or alloys thereof in another embodiment. The electrically conductive layer 103 can be a copper layer or a silver layer in another embodiment.

The conductive paste 105 is capable of bonding one metallic conductor to another, a metallic conductor to a semiconductor, or a semiconductor to another semiconductor. The conductive paste 105 is applied on the electrically conductive layer 103. The applied conductive paste 105 can be 50 to 500 μm thick in an embodiment, 80 to 300 μm thick in another embodiment, 100 to 200 μm thick in another embodiment. The conductive paste 105 is applied by any suitable deposition technique including, without limitation, screen printing. A mask (most commonly constructed of metal) can be used for the screen printing in some embodiments.

The applied conductive paste 105 is optionally dried. The drying temperature can be 40 to 150° C. in an embodiment, 50 to 120° C. in another embodiment, 60 to 100° C. in another embodiment. The drying time is 10 to 150 minutes in an embodiment, 15 to 80 minutes in another embodiment, 20 to 30 minutes in another embodiment.

The electrical component 107 is mounted on the applied conductive paste 105. The electrical component 107 is not particularly limited as long as it functions electrically. For example, electrical component 107 can be selected from the group consisting of a semiconductor chip, an integrated circuit (IC) chip, a chip resistor, a chip capacitor, a chip inductor, a sensor chip, and a combination thereof. The electrical component 107 can be a semiconductor chip in another embodiment. The semiconductor chip can be a Si chip or a SiC chip in another embodiment.

The electrical component 107 in some embodiments comprises a metallization layer, which may be situated in contact with the adjacent layer of the applied conductive paste 105. The material of the metallization layer can be selected from the group consisting of copper, silver, gold, nickel, palladium, platinum, alloy thereof and a mixture thereof in another embodiment. The metallization layer comprises gold and/or nickel in another embodiment. The metallization layer comprises a lamination of a gold layer and a nickel layer in still another embodiment. The metallization layer is provided by plating in another embodiment.

The layer of the conductive paste 105 is heated to accomplish the required bonding. In various embodiments, the heating is carried out in a die bonder set at a temperature between 150, 180, 200, or 220° C. and 260, 290, 310, and 400° C. for a heating time ranging between 0.1, 0.5, 3, 5, or 10 min. and 3, 5, 10, 15, 20, or 30 min. Alternatively, the heating step can be carried out in an oven or using any other convenient heat source. Heat damage to the electrical component 107 can be minimized or eliminated because the conductive paste 105 can be bonded at a relatively low temperature.

In various embodiments, the heating step is carried out in different atmospheres, such as a reducing atmosphere (e.g., a $N_2$ atmosphere) or in air.

To improve adherence of the electrical component 107 to the conductive paste layer 105, pressure is applied on the electrical component 107 during the heating in some embodiments. The pressure can range from 0.1, 5, 7, 15, or 25 MPa to 15, 25, 36, 40, or 45 MPa. Alternatively, the electrical component 107 can be bonded without pressurization. An oven or a die bonder can be used for heating.

The composition of the conductive paste 105 is explained hereafter. The conductive paste 105 comprises a metal powder and a solvent.

Metal Powder

In an embodiment, the metal powder is selected from the group consisting of silver, copper, gold, palladium, platinum, rhodium, nickel, aluminum, an alloy thereof and a combination thereof. The metal powder is selected from the group consisting of silver, copper, nickel, an alloy thereof and a combination thereof in another embodiment. The metal powder is silver in still another embodiment.

The shape of the metal powder is in the form of flake, spherical, amorphous or a mixture thereof in an embodiment. The shape of the metal powder is a mixture of flake and spherical in another embodiment. By "spherical powder" is meant a powder of particles that have a ratio of the largest diameter of each particle to the smallest diameter of at most 2:1. In other embodiments, the ratio is at most 1.8:1, 1.5:1, or 1.3:1, depending on how the powder is prepared.

The size of the particles of the metal powder used in the present composition may be specified by values of D50. Unless otherwise indicated, the term "particle diameter" refers herein to a value of "D50," which is a median particle size by volume for an ensemble of particles, which may be determined using a laser diffraction method carried out with using Microtrac X-100 (Montgomeryville, PA) instrument.

The particle diameter (D50) of the metal powder used in various embodiments of the present paste has a value between 0.01, 0.05, 0.07, 0.1, 0.2 μm, or 0.3 μm and 2, 3, or 5 μm. It is found that particles of these sizes can be dispersed well in the solvent.

In various embodiments, the present paste comprises an amount of metal powder that ranges from 60, 72, 80, or 85 wt. % to 93, 95, or 97 wt. %, based on the total weight of the conductive paste.

Solvent

The metal powder is dispersed in a suitable solvent to form the conductive paste. The amount of solvent can be varied to adjust the viscosity so that the conductive paste 105 can be readily applied onto the substrate 101 or the electrically conductive layer 103. All or most of the solvent evaporates from the conductive paste 105 during the drying step or the heating step.

The molecular weight of the solvent is 600 or less in an embodiment, 520 or less in another embodiment, 480 or less in another embodiment, 400 or less in another embodiment. The molecular weight of the solvent is at least 10 in an embodiment, at least 100 in another embodiment, at least 150 in another embodiment, at least 180 in another embodiment.

The boiling point of the solvent is 100 to 450° C. in an embodiment, 150 to 320° C. in another embodiment, 200 to 290° C. in another embodiment. The solvent is an organic solvent in an embodiment.

Suitable solvents include ones selected from the group consisting of ester alcohols, 1-phenoxy-2-propanol, terpineol, carbitol acetate, ethylene glycol, butyl carbitol, dibutyl carbitol, dibutyl acetate propylene glycol phenyl ether, ethylene glycol monobutyl ether, butyl carbitol acetate, 1,2-cyclohexane dicarboxylic acid diisononyl ester and a mixture thereof in an embodiment. A preferred ester alcohol is the monoisobutyrate of 2,2,4-trimethyl-1,3-pentanediol, which is available commercially from Eastman Chemical (Kingsport, TN) under the tradename TEXANOL™.

In some embodiments, conductive paste 105 has a viscosity that is between 10, 15, or 20 Pa-s and 50, 100, or 300 Pa-s, when measured at a shear rate of 10 $sec^{-1}$ with a rheometer (HAAKE™ MARS™ III, Thermo Fisher Scientific Inc.) using a titanium cone plate C20/1°.

The solvent is present in some embodiments in an amount between 5, 6.5, 7.8, or 8.8 parts by weight and 13, 15, or 20 parts by weight when the metal powder is 100 parts by weight.

The solvent is present in other embodiments in an amount between 2, 4, 6, or 7.5 wt. % and 15, 20, or 25 wt. %, based on the total weight of the conductive paste.

The solvent may comprise multiple solvent components. In some embodiments, the solvent comprises a first solvent and a second solvent, wherein the boiling point of the first solvent is 100 to 280° C. and the boiling point of the second solvent is 285 to 500° C. In other embodiments, the boiling point of the first solvent is 130 to 270° C., 140 to 260° C., 180 to 250° C., or 210 to 240° C.

The first solvent can be selected from the group consisting of butyl carbitol, Texanol™ ester alcohol, 1-phenoxy-2-propanol, terpineol, butyl carbitol acetate, ethylene glycol, dibutyl carbitol, ethylene glycol monobutyl ether, triethylene glycol dimethyl ether, ethylene glycol butyl ether acetate, ethylene glycol butyl ether, diethylene glycol butyl ether acetate, diethylene glycol butyl ether, diethylene glycol ethyl ether acetate, dipropylene glycol methyl ether, propylene glycol methyl ether acetate, diethylene glycol dibutyl ether, propylene glycol phenyl ether, propylene glycol methyl ether, dipropylene glycol n-propyl ether, ethylene glycol diacetate, propylene glycol, ethylene glycol phenyl ether, 2,2,4-trimethyl-1,3-pentanediol monoisobutyrate, dipropylene glycol methyl ether acetate, and a mixture thereof in another embodiment. The first solvent comprises at least Texanol™ ester alcohol in another embodiment. The first solvent comprises at least butyl carbitol in another embodiment. The first solvent is butyl carbitol in another embodiment. The first solvent is Texanol™ ester alcohol in another embodiment. The first solvent is a mixture of butyl carbitol and Texanol™ ester alcohol in another embodiment. For example, the weight ratio of the amounts of butyl carbitol and Texanol™ ester alcohol present may be 1:1 to 1:20, 1:1 to 1:18, 1:1 to 1:10, 1:1 to 1:6, or 1:1 to 1:5 in such embodiments.

In an embodiment, the molecular weight of the first solvent is in a range between 10, 100, 150, or 180 and 400, 480, 520, or 600.

The first solvent is present in some embodiments in an amount between 0.1, 0.5, 1.2, 2, and 4 parts by weight and 6, 8, or 10 parts by weight, when the metal powder is 100 parts by weight.

The boiling point of the second solvent is between 295, 300, 310, or 380° C. and 400, 410, 440, or 460° C. in some embodiments.

The second solvent can be selected from the group consisting of dibutyl phthalate, isostearyl alcohol, 1,2-cyclohexanedicarboxylate diisononyl ester, isostearic acid and a mixture thereof in an embodiment. The second solvent is 1,2-cyclohexanedicarboxylate diisononyl ester in another embodiment.

In embodiments that include multiple solvents, each one may have a molecular weight within ranges that are specified independently. For example, each solvent may have a molecular weight between 10, 100, 150, or 180 and 400, 480, 520, or 600.

The second solvent is present in some embodiments in an amount between 0.5, 1.2, 3, 5.5, or 6 parts by weight and 6, 9, 12, or 16 parts by weight, when the metal powder is 100 parts by weight.

The boiling point of the second solvent is greater than the boiling point of the first solvent by at least 50, 80, 100, 140, 150, or 160° C. or more in certain embodiments.

The total amount of the first solvent and the second solvent present in some embodiments may be from 3, 4, 6, or 8 parts by weight to 14, 17, or 20 parts by weight, when the metal powder is 100 parts by weight.

The amount and type of the first solvent and the second solvent can be adjusted in accordance with a desired viscosity of the conductive paste 105. The viscosity of the conductive paste 105 is 10 to 300 Pa·s in an embodiment, 15 to 100 Pa·s in another embodiment, 20 to 50 Pa·s in another embodiment, when measured at a shear rate of 10 sec$^{-1}$ with a rheometer (HAAKE™ MARS™ III, Thermo Fisher Scientific Inc.) using a titanium cone plate C20/1°.

Conductive pastes used heretofore for bonding have typically incorporated only solvents having a relatively low boiling point, so that the solvent could be completely evaporated during the heating step. However, in some embodiments of the present disclosure, a portion of the low boiling point solvent is replaced by another solvent having a higher boiling point. Without being bound by any specific theory of operation, it is believed that tackiness could thereby be imparted to the applied conductive paste to enhance the adherence of the electrical component to the paste during the manufacturing process. The results herein indicate that the second solvent sufficiently evaporates together with the first solvent, so that a desirable level of bonding is maintained between the electrical component and the conductive paste layer.

Polymer

The conductive paste 105 optionally comprises a polymer that is soluble in the solvent, and has a molecular weight (Mw) of 1,000 or more. In other embodiments, the molecular weight (Mw) of the polymer has a value between 5,000, 8,000, 10,000, 18,000, 25,000, or 32,000 and 200,000, 350,000, 480,000, 610,000, 780,000, or 900,000. Unless otherwise stated, references to the molecular weight of polymers in the present application pertain to the weight average molecular weight (Mw) expressed in daltons, which can be measured with a high-performance liquid chromatography system, such as an Alliance 2695 (Nippon Waters Co., Ltd.), or the like.

In an embodiment, the polymer in the present composition is selected from the group consisting of ethyl cellulose, methylcellulose, hydroxypropyl cellulose, polyvinyl butyral resin, phenoxy resin, polyester resin, epoxy resin, acrylic resin, polyimide resin, polyamide resin, polystyrene resin, butyral resin, polyvinyl alcohol resin, polyurethane resin and a mixture thereof. The polymer is ethyl cellulose in another embodiment.

The glass transition temperature of the polymer is −30 to 250° C. in an embodiment, 10 to 180° C. in another embodiment, 80 to 150° C. in another embodiment.

In various embodiments, the polymer is present in an amount in a range from 0.02, 0.1, or 0.2 parts by weight to 0.7, 1.0, 1.8, 2.8, or 4 parts by weight, when the metal powder is 100 parts by weight.

In other embodiments, the polymer is present in an amount in a range from 0.01, 0.05, 0.1, or 0.15 wt. % to 0.5, 1, or 2 wt. %, based on the total weight of the conductive paste 105.

In some embodiments, the conductive paste 105 comprises at least two polymers of at least two different types. For example, the paste may comprise first and second polymers that are both soluble in the solvent system, the first polymer having a molecular weight less than that of the second polymer. The polymers may be polymerized from different monomers, or may have the same monomer base but have different numbers of repeat units and thus different molecular weights.

In various embodiments, the first polymer has a molecular weight (Mw) in a range between 5,000, 8,000, 10,000, 18,000, 25,000, or 32,000 and 49,000, 55,000, 60,000, 68,000, 79,000, 88,000, or 95,000.

The first polymer may be selected from the group consisting of ethyl cellulose, methylcellulose, hydroxypropyl cellulose, polyvinyl butyral resin, phenoxy resin, polyester resin, epoxy resin, acrylic resin, polyimide resin, polyamide resin, polystyrene resin, butyral resin, polyvinyl alcohol resin, polyurethane resin and a mixture thereof in an embodiment. The first polymer is ethyl cellulose in another embodiment.

The glass transition temperature of the first polymer is −30 to 250° C. in an embodiment, 10 to 180° C. in another embodiment, 80 to 150° C. in another embodiment.

In various embodiments, the first polymer is present in an amount in a range between 0.01, 0.05, or 0.1 parts by weight and 0.5, 0.9, 1.4, or 2 parts by weight, when the metal powder is 100 parts by weight.

In other embodiments, the first polymer is present in an amount between 0.05, 0.08, or 0.1 wt. % and 0.5, 1, or 1.5 wt. %, based on the total weight of the conductive paste.

The molecular weight of the second polymer is larger than that of the first polymer in an embodiment. For example, the second polymer may have a molecular weight (Mw) in a range between 100,000, 105,000, 115,000, or 150,000 and 200,000, 350,000, 480,000, 810,00, 780,000, or 900,000.

The second polymer may be selected from the group consisting of ethyl cellulose, methylcellulose, hydroxypropyl cellulose, polyvinyl butyral resin, phenoxy resin, polyester resin, epoxy resin, acrylic resin, polyimide resin, polyamide resin, polystyrene resin, butyral resin, polyvinyl alcohol resin, polyurethane resin and a mixture thereof in an embodiment. The second polymer is ethyl cellulose, acrylic resin or a mixture thereof in another embodiment.

The glass transition temperature of the second polymer is −30 to 250° C. in an embodiment, 10 to 180° C. in another embodiment, 80 to 150° C. in another embodiment.

In various embodiments, the second polymer is present in an amount in a range between 0.01, 0.05, or 0.1 parts by weight and 0.5, 0.9, 1.4, or 2 parts by weight, when the metal powder is 100 parts by weight.

In other embodiments, the first polymer is present in an amount between 0.05, 0.08, or 0.1 wt. % and 0.5, 1, or 1.5 wt. %, based on the total weight of the conductive paste 105.

The mixing weight ratio of the first polymer and the second polymer (first polymer second polymer) is 10:1 to 0.1:1 in an embodiment, 5:1 to 0.5:1 in another embodiment, 2:1 to 0.8:1 in another embodiment.

In various embodiments, the first polymer and the second polymer together may be present in an amount between 0.02, 0.1, or 0.2 parts by weight and 1.1, 1.8, 2.8, or 4 parts by weight, when the metal powder is 100 parts by weight.

In other embodiments, the first polymer and the second polymer together may be present in an amount between 0.01, 0.05, 0.1, or 0.15 wt. % and 0.5, 1, or 2 wt. %, based on the total weight of the conductive paste 105.

In certain embodiments, the molecular weight of the second polymer is greater than the molecular weight of the first polymer by at least 10,000, 40,000, 80,000, 100,000, or 130,000.

In some embodiments having a mixture of multiple polymers, there is a sufficient amount of each polymer for a molecular weight distribution of the mixture to exhibit a separately discernable peaks. In other embodiments, particularly ones in which there is a lesser amount of one of the polymers, multiple peaks may not be readily discernable. In some embodiments, the first polymer could exhibit a molecular weight distribution separately discernable from the second polymer's molecular weight distribution. In still another alternative, the polymers included are of different types, but with a difference between their molecular weights not being sufficient for separate peaks to be distinguished in a molecular weight distribution of the mixture. The first polymer and the second polymer are both ethyl cellulose in an embodiment. The first polymer is ethyl cellulose and the second polymer is acrylic resin in another embodiment.

Without being bound by any specific theory of operation, it is believed that certain embodiments benefit from the presence of two polymers, with both contributing to desirable rheological properties that improve the behavior of the paste during deposition, while the second, higher molecular weight polymer component acts to retain the solvent in the paste. A desirable level of tackiness is thus maintained. It is further believed that the improvement in tackiness may be caused by the second polymer's propensity to foster better retention of the solvent in the conductive paste. It is also believed that embodiments having multiple solvents with a single polymer may similarly benefit from the preferential interaction of one of the solvents with the polymer to improve tackiness.

The foregoing mechanisms are believed to be particularly effective in embodiments that include both two polymers and two solvents with different molecular weights and/or boiling points. Together, embodiments with any or all these compositional features and characteristics may exhibit a desirably improved adherence of the conductive paste during the manufacturing process described herein.

Additive

One or more additives including, without limitation, surfactants, dispersing agents, emulsifiers, stabilizers, plasticizers, or other known paste additives can be further incorporated in conductive paste 105 to improve its functional properties in one or more of its formulation, storage, application, and end use. The conductive paste 105 does not comprise a glass frit in an embodiment. Embodiments in which conductive paste 105 does not comprise a curing agent or a cross-linking agent are also contemplated herein.

EXAMPLE

The present invention is illustrated by, but is not limited to, the following examples.

Examples 1-2

A conductive paste was prepared by dispersing a silver powder in a mixture of an organic solvent, a first polymer, a second polymer, and a surfactant. The dispersion was carried out by mixing the components in a mixer followed by a three-roll mill. The silver powder was a mixture of a spherical silver powder having a particle diameter (D50) of 0.4 μm and a flaky silver powder having particle diameter (D50) of 1.6 μm. The solvent was a mixture of TEXANOL™ ester alcohol and butyl carbitol.

The first polymer was ethyl cellulose having a molecular weight (Mw) of 44,265 (Ethocel® N4, Dow Chemical Company). The second polymer was ethyl cellulose having a molecular weight (Mw) of 135,021 (Ethocel® STD45, Dow Chemical Company) or ethyl cellulose having a molecular weight (Mw) of 187,800 (Ethocel® STD200, Dow Chemical Company). The glass transition temperature of both the first and second polymers was about 130° C., regardless of the molecular weight. The molecular weight was measured with a high-performance liquid chromatography (Alliance 2695, Nippon Waters Co., Ltd.). The amount of each component is shown in Table 1. The amount of the surfactant was 0.01 parts by weight. The viscosity of the conductive paste was 25 to 30 Pa-s, as measured at a shear rate of 10 sec$^{-1}$ using a rheometer (HAAKE™ MARS™ III, titanium cone-plate:C20/1°, Thermo Fisher Scientific Inc.). Paste for Comparative Example 1 was prepared using the same techniques.

Next, a conductive paste layer was formed for each example by applying the conductive paste on a glass substrate. It is considered that similar results could also be obtained using a glass substrate that includes a conductive layer. A series of pressure-sensitive tapes (Scotch® Magic™ MP-18 transparent tape, 3M Corporation) were put on the glass substrate (50 mm wide, 75 mm long, 1 mm thick) with a space of 15 mm between adjacent pieces. The conductive paste was applied with a scraper over the tapes to fill the space between them with the conductive paste. The tapes were then peeled off, leaving behind the applied conductive paste in a pattern of squares 10 mm wide, 10 mm long, and 150 µm thick. The conductive paste layer was dried at 80° C. for 15 minutes in an oven.

The adhesion of the upper surface of the conductive paste layer was measured with a tensile tester (Chatillon® TCM 201-SS, Wagner Instruments). The head of the tester was pressed against the surface of the conductive paste layer for 5 seconds with a force of 100 gf and then pulled up at a speed of 0.1 inch/min. The tension when the tester head was separated from the surface of the conductive paste layer was taken as the peel strength.

The results are shown in Table 1. The peel strengths were measured relative to the strength of the Comparative Example 1 paste layer, which was taken as 100. The peel strength was improved to 118 and 144 in Examples 1 and 2, respectively. These results are attributed to inclusion of a mixture of the two polymers having different molecular weights, whereas Comparative Example 1 used a paste that included only a single, low molecular weight polymer.

TABLE 1

| | | Comparative Example 1 | Example 1 | (parts by weight) Example 2 |
|---|---|---|---|---|
| Ag powder | | 100 | 100 | 100 |
| Solvent | | 10 | 10 | 10 |
| 1st Polymer | (Mw: 44,265) | 0.4 | 0.2 | 0.2 |
| 2nd Polymer | (Mw: 135,021) | 0 | 0.2 | 0 |
| | (Mw: 187,800) | 0 | 0 | 0.2 |
| Peel Strength (relative value) | | 100 | 118 | 144 |

Example 3

Another conductive paste was prepared and tested using the same materials and procedures described above for Example 1 and 2, except that the second polymer was an acrylic resin having a molecular weight of 142,000 and a glass transition point of 20° C. (Elvacite) 2044, Lucite International Ltd.) instead of ethyl cellulose. The result is shown in Table 2. The relative peel strength was improved to 135 in Example 3 where the first polymer of low molecular weight and the second polymer of high molecular weight were mixed, with the peel strength from Comparative Example 1 being taken as 100.

TABLE 2

| | (parts by weight) Example 3 |
|---|---|
| Ag powder | 100 |
| Solvent | 10 |
| 1st Polymer Ethyl cellulose | 0.2 |
| 2nd Polymer Acrylic resin | 0 |
| Peel Strength (relative value) | 144 |

Examples 4-8

Additional conductive paste compositions were formulated using the formulation and test procedures described above for Examples 1-2.

The silver powder was a mixture of a spherical silver powder having particle diameter (D50) of 0.4 m and a flaky silver powder having particle diameter (D50) of 1.6 µm.

As set forth in Table 3, the solvents used were mixtures of multiple organic solvents having different boiling points. The first solvent for each example was a mixture of butyl carbitol (boiling point: 231° C.) and Texanol™ ester alcohol (boiling point: 254° C.). These solvents can also be used singly or in a mixture of any proportion. Any one or more other low boiling solvents could also be used instead of, or in combination with, butyl carbitol and Texano™ ester alcohol. The selection is preferably made in consideration of the solubility of the polymer used in this or in other embodiments that include one or more polymers.

The second solvents were dibutyl phthalate (boiling point: 340° C.), isostearyl alcohol (boiling point: 316° C.), 1,2-cyclohexanedicarboxylate diisononyl ester (boiling point: 394° C.), isostearic acid (boiling point: 331° C.), and isostearic acid (boiling point: 320° C.) for Examples 4-7, respectively. Example 8 also used 1,2-cyclohexanedicarboxylate diisononyl ester as the second solvent. The polymer was ethyl cellulose (Ethocel® N4, Dow Chemical Company). The paste for Comparative Example 2 was prepared similarly, but without the second solvent.

The amount of each component is shown in Table 1. In each case, 0.01 parts by weight of a surfactant was included. The viscosity of the conductive paste formed by dispersing the silver powder was 25 to 30 Pa s. The viscosity was measured at a shear rate of 10 sec$^{-1}$ using a rheometer (HAAKE™ MARS™ III, with a titanium cone-plate:C20/1°, Thermo Fisher Scientific Inc.).

The conductive pastes of Examples 4-8 were formed into patterns of squares on glass substrates using the same process described for Examples 1-2 above, except that the drying was carried out at 70° C. for 25 minutes.

The peel strengths of the conductive pastes of Examples 4-8 were measured as before, yielding the results shown in Table 3. The peel strengths are again shown as values relative to that obtained with Comparative Example 2, which was taken as 100.

TABLE 3

| | | Com. Ex. 2 | Ex. 4 | Ex. 5 | Ex. 6 | (parts by weight) Ex. 7 | Ex. 8 |
|---|---|---|---|---|---|---|---|
| Ag powder | | 100 | 100 | 100 | 100 | 100 | 100 |
| Polymer | | 0.3 | 0.3 | 0.3 | 0.3 | 0.3 | 0.3 |
| Solvent | (Bp) | | | | | | |
| Texanol ™ | (254° C.) | 10.7 | 2.7 | 2.7 | 2.7 | 2.7 | 4.7 |
| Butyl carbitol | (231° C.) | 1 | 1 | 1 | 1 | 1 | 1 |
| Dibutyl phthalate | (339° C.) | 0 | 7 | 0 | 0 | 0 | 0 |
| Isostearyl alcohol | (316° C.) | 0 | 0 | 7 | 0 | 0 | 0 |
| 1,2-cyclohexane-dicarboxylate diisononyl ester | (394° C.) | 0 | 0 | 0 | 7 | 0 | 5 |
| Isostearic add | (320° C.) | 0 | 0 | 0 | 0 | 7 | 0 |
| Peel Strength (relative value) | | 100 | 125 | 125 | 129 | 130 | 145 |

Having thus described the invention in rather full detail, it will be understood that this detail need not be strictly adhered to but that further changes and modifications may suggest themselves to one skilled in the art, all falling within the scope of the invention as defined by the subjoined claims.

For example, a skilled person would recognize that the choice of raw materials could unintentionally include impurities that may be incorporated into the oxide composition or other paste constituents during processing. These incidental impurities may be present in the range of hundreds to thousands of parts per million. Impurities commonly occurring in industrial materials used herein are known to one of ordinary skill.

Where a range of numerical values is recited or established herein, the range includes the endpoints thereof and all the individual integers and fractions within the range, and also includes each of the narrower ranges therein formed by all the various possible combinations of those endpoints and internal integers and fractions to form subgroups of the larger group of values within the stated range to the same extent as if each of those narrower ranges was explicitly recited. Where a range of numerical values is stated herein as being greater than a stated value, the range is nevertheless finite and is bounded on its upper end by a value that is operable within the context of the invention as described herein. Where a range of numerical values is stated herein as being less than a stated value, the range is nevertheless bounded on its lower end by a non-zero value. It is not intended that the scope of the invention be limited to the specific values recited when defining a range.

In this specification, unless explicitly stated otherwise or indicated to the contrary by the context of usage, where an embodiment of the subject matter hereof is stated or described as comprising, including, containing, having, being composed of, or being constituted by or of certain features or elements, one or more features or elements in addition to those explicitly stated or described may be present in the embodiment. An alternative embodiment of the subject matter hereof, however, may be stated or described as consisting essentially of certain features or elements, in which embodiment features or elements that would materially alter the principle of operation or the distinguishing characteristics of the embodiment are not present therein. A further alternative embodiment of the subject matter hereof may be stated or described as consisting of certain features or elements, in which embodiment, or in insubstantial variations thereof, only the features or elements specifically stated or described are present. Additionally, the term "comprising" is intended to include examples encompassed by the terms "consisting essentially of" and "consisting of." Similarly, the term "consisting essentially of" is intended to include examples encompassed by the term "consisting of."

In this specification, unless explicitly stated otherwise or indicated to the contrary by the context of usage, amounts, sizes, ranges, formulations, parameters, and other quantities and characteristics recited herein, particularly when modified by the term "about," may but need not be exact, and may also be approximate and/or larger or smaller (as desired) than stated, reflecting tolerances, conversion factors, rounding off, measurement error, and the like, as well as the inclusion within a stated value of those values outside it that have, within the context of this invention, functional and/or operable equivalence to the stated value.

What is claimed is:

1. A method of manufacturing an electronic device comprising the steps of: preparing a substrate comprising an electrically conductive layer; applying a conductive paste on the electrically conductive layer; mounting an electrical component on the applied conductive paste; heating the conductive paste at a temperature of from 150° C. to 400° C. to bond the electrically conductive layer and the electrical component, wherein the conductive paste comprises 100 parts by weight of metal powder selected from the group consisting of silver, copper, gold palladium, platinum, rhodium, nickel, aluminum, and a combination thereof, 5 to 20 parts by weight of a solvent, and 0.05 to 3 parts by weight of a polymer, wherein the polymer comprises a first polymer and a second polymer, wherein the molecular weight (Mw) of the first polymer is 5,000 to 95,000 Da, and the molecular weight (Mw) of the second polymer is 100,000 to 300,000 Da, and wherein the first polymer and the second polymer are selected from the group consisting of ethyl cellulose, methylcellulose, hydroxypropyl cellulose, polyvinyl butyral resin, phenoxy resin, polyester resin, epoxy resin, acrylic resin, polyimide resin, polyamide resin, polystyrene resin, butyral resin, polyvinyl alcohol resin, polyurethane resin and a mixture thereof.

2. The method of claim 1, wherein the electrical component is a semiconductor chip.

3. The method of claim 1, wherein the electrical component includes a plating layer selected from the group consisting of nickel, gold, and alloys thereof.

4. The method of claim 1, wherein the method further comprises the step of drying at 40 to 150° C. after applying the conductive paste on the electrically conductive layer and before mounting the electrical component on the applied conductive paste.

5. The method of claim 1, wherein a pressure is applied on the electrical component during the heating step.

6. The method of claim 1, wherein the metal powder consists of silver and/or copper.

7. A method of manufacturing an electronic device comprising the steps of: preparing a substrate comprising an electrically conductive layer; applying a conductive paste on the electrically conductive layer mounting an electrical component on the applied conductive paste; and heating the conductive paste at a temperature of from 150° C. to 400° C. to bond the electrically conductive layer and the electrical component, wherein the conductive paste for bonding comprising a metal powder selected from the group consisting of silver, copper, gold, palladium, platinum, rhodium, nickel, aluminum, and a combination thereof, a polymer, wherein the polymer comprises a first polymer and a second polymer, wherein the molecular weight (Mw) of the first polymer is 5,000 to 95,000 Da, and the molecular weight (Mw) of the second polymer is 100,000 to 300,000 Da, and a solvent, wherein the solvent comprises a first solvent and a second solvent, wherein the boiling point of the first solvent is 100 to 280° C., and the boiling point of the second solvent is 285 to 500° C.

8. The method of claim 7, wherein the electrical component is a semiconductor chip.

9. The method of claim 7, wherein the electrical component includes a plating layer selected from the group consisting of nickel, gold, and alloys thereof.

10. The method of claim 7, wherein the method further comprises the step of drying at 40 to 150° C. after applying the conductive paste on the electrically conductive layer and before mounting the electrical component on the applied conductive paste.

11. The method of claim 7, wherein the conductive paste comprises 100 parts by weight of a metal powder consisting of silver and/or copper, 5 to 20 parts by weight of a solvent, 0.02 to 4 parts by weight of a polymer, wherein the solvent comprises a first solvent and a second solvent, wherein the boiling point of the first solvent is 100 to 280° C., and the boiling point of the second solvent is 285 to 500° C.

12. The method of claim 1, wherein the conductive paste consists essentially of 100 parts by weight of metal powder selected from the group consisting of silver, copper, gold palladium, platinum, rhodium, nickel, aluminum, and a combination thereof, 5 to 20 parts by weight of the solvent, and 0.05 to 3 parts by weight of the polymer.

13. The method of claim 7, wherein the conductive paste consists essentially of 100 parts by weight of metal powder selected from the group consisting of silver, copper, gold palladium, platinum, rhodium, nickel, aluminum, and a combination thereof, 5 to 20 parts by weight of the solvent, and 0.05 to 3 parts by weight of the polymer.

\* \* \* \* \*